US011070023B2

(12) United States Patent
Tayebati et al.

(10) Patent No.: US 11,070,023 B2
(45) Date of Patent: Jul. 20, 2021

(54) DIAMOND-COATED COMPOSITE HEAT SINKS FOR HIGH-POWER LASER SYSTEMS

(71) Applicant: PANASONIC INTELLECTUAL PROPERTY MANAGEMENT CO., LTD., Osaka (JP)

(72) Inventors: Parviz Tayebati, Sherborn, MA (US); Myrna Reyes, Middleton, MA (US); Xiuying Wu, Dracut, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 115 days.

(21) Appl. No.: 16/223,339

(22) Filed: Dec. 18, 2018

(65) Prior Publication Data
US 2019/0190232 A1   Jun. 20, 2019

Related U.S. Application Data

(60) Provisional application No. 62/607,378, filed on Dec. 19, 2017.

(51) Int. Cl.
*C23F 1/16* (2006.01)
*C23C 16/27* (2006.01)
(Continued)

(52) U.S. Cl.
CPC .......... *H01S 5/02469* (2013.01); *B21D 53/02* (2013.01); *C23C 16/02* (2013.01);
(Continued)

(58) Field of Classification Search
CPC ............. H01S 5/02469; H01S 5/02423; H01S 5/02276; H01S 5/4087; H01S 5/4062;
(Continued)

(56) References Cited

U.S. PATENT DOCUMENTS 4,172,005 A * 10/1979 Muraoka ........... H01L 21/76297
252/79.5
2001/0000337 A1   6/2001 Yoo et al.
(Continued)

FOREIGN PATENT DOCUMENTS

CN            106602401 A      4/2017

OTHER PUBLICATIONS

International Search Report and Written Opinion issued in a corresponding International Application No. PCT/ IB2018/001629, 11 pages, dated May 31, 2019.

*Primary Examiner* — Jermie E Cozart
(74) *Attorney, Agent, or Firm* — Morgan, Lewis & Bockius LLP

(57) ABSTRACT

In various embodiments, laser systems feature beam emitters thermally coupled to heat sinks comprising, consisting essentially of, or consisting of a metal-matrix composite of a thermally conductive metal and a refractory metal. At least a portion of the surface of the heat sink is treated to form a depleted region, and a diamond coating is deposited within and/or over the depleted region. The depleted region is substantially free of the thermally conductive metal or contains the thermally conductive metal at a concentration less than that of the body of the heat sink.

33 Claims, 7 Drawing Sheets

(51) Int. Cl.
*C23C 16/02* (2006.01)
*B21D 53/02* (2006.01)
*H01S 5/024* (2006.01)
*C23F 1/18* (2006.01)
*C23F 1/44* (2006.01)
*C23F 1/02* (2006.01)
*H01S 5/02345* (2021.01)
*H01S 5/40* (2006.01)
*H01S 5/14* (2006.01)
*H01S 5/02365* (2021.01)

(52) U.S. Cl.
CPC ................ *C23C 16/27* (2013.01); *C23F 1/02* (2013.01); *C23F 1/16* (2013.01); *C23F 1/18* (2013.01); *C23F 1/44* (2013.01); *H01S 5/02345* (2021.01); *H01S 5/02423* (2013.01); *H01S 5/02365* (2021.01); *H01S 5/02484* (2013.01); *H01S 5/143* (2013.01); *H01S 5/4062* (2013.01); *H01S 5/4087* (2013.01)

(58) Field of Classification Search
CPC .. H01S 5/143; H01S 5/02264; H01S 5/02484; C23F 1/18; C23F 1/44; C23F 1/02; C23F 1/16; C23C 16/27; C23C 16/02; B21D 53/02
See application file for complete search history.

(56) References Cited

U.S. PATENT DOCUMENTS

| | | |
|---|---|---|
| 2002/0003741 A1 | 3/2002 | Saito et al. |
| 2015/0014074 A1 | 5/2015 | Moldovan et al. |
| 2016/0000356 A1 | 1/2016 | Dutta |
| 2017/0093121 A1* | 3/2017 | Huang ................. H01S 5/4025 |
| 2017/0009892 A1 | 4/2017 | Chann et al. |

\* cited by examiner

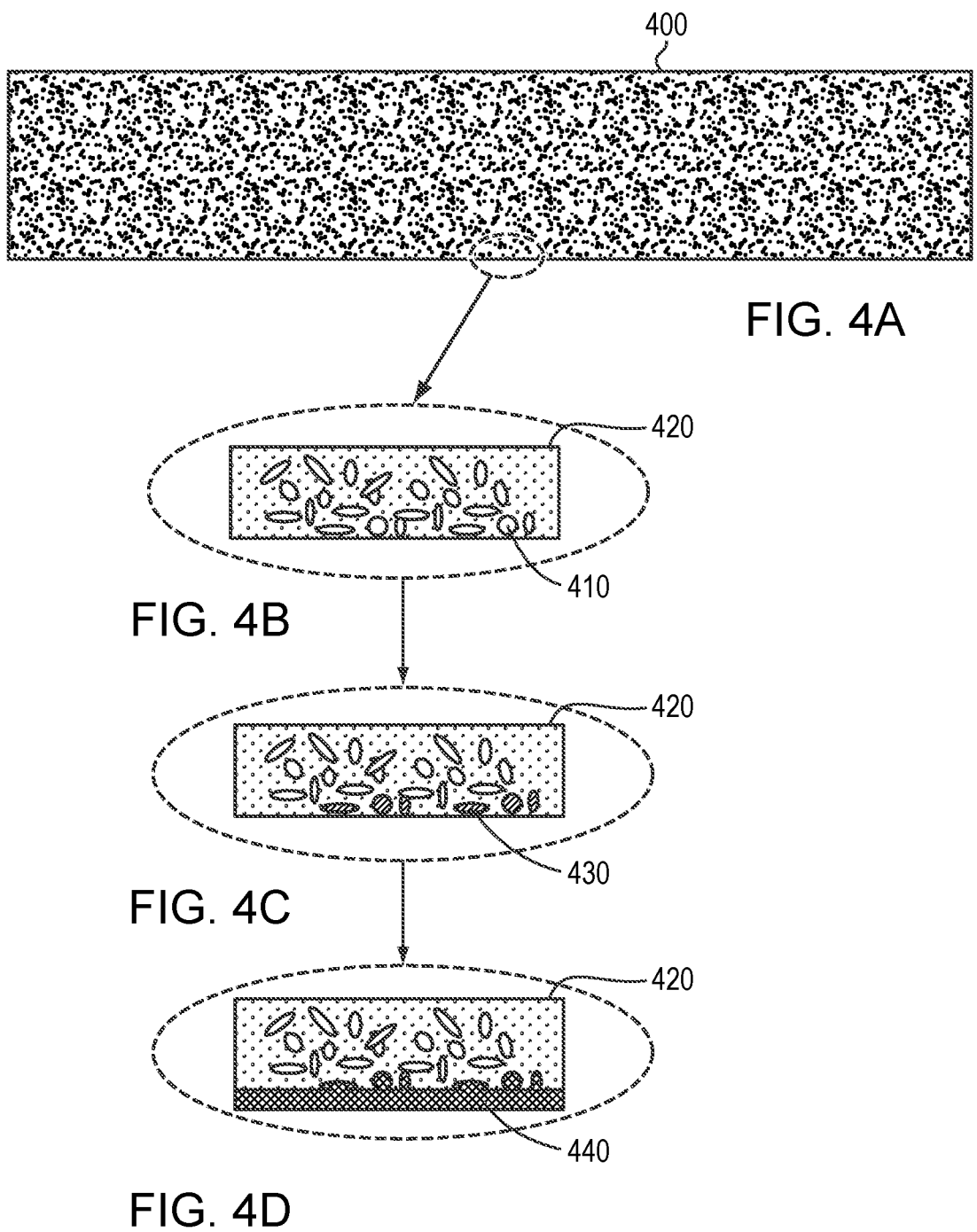

DIAMOND-COATED COMPOSITE HEAT SINKS FOR HIGH-POWER LASER SYSTEMS

RELATED APPLICATION

This application claims the benefit of and priority to U.S. Provisional Patent Application No. 62/607,378, filed Dec. 19, 2017, the entire disclosure of which is hereby incorporated herein by reference.

TECHNICAL FIELD

In various embodiments, the present invention relates to laser systems incorporating heat sinks for thermal management, specifically heat sinks featuring diamond coatings.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. Wavelength beam combining (WBC) is a technique for scaling the output power and brightness from laser diodes, laser diode bars, stacks of diode bars, or other lasers arranged in a one- or two-dimensional array. WBC methods have been developed to combine beams along one or both dimensions of an array of emitters. Typical WBC systems include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

While techniques such as WBC have succeeded in producing laser-based systems for a wide variety of applications, wider adoption of such systems has resulted in the demand for ever-higher levels of laser output power. Typically higher laser powers involve the driving of laser diodes at increasingly higher currents, which results in higher operating temperatures and concomitant thermal-management issues aimed at preventing temperature-based reliability issues. While high-power laser systems typically utilize heat sinks composed of thermally conductive metals or other materials to draw heat away from the laser emitter itself, the thermal-management demands of some systems also require the use of a circulating liquid coolant (e.g., water) to expedite heat removal. The use of such coolants may result in corrosion and/or erosion of the heat-sink material, which can lead to lifetime and reliability issues. Thus, there is a need for thermal-management solutions that address these issues.

SUMMARY

In accordance with embodiments of the present invention, laser devices incorporating beam emitters such as laser diodes (e.g., single laser diodes, laser diode bars, or arrays thereof) utilize heat sinks (e.g., electrode mounts and/or thermally conductive housings) that feature thereon a diamond coating, at least on surfaces (or portions thereof) that are exposed to stagnant and/or flowing liquid coolants such as water. As known in the art, diamond is quite thermally conductive, as well as being resistant to erosion and corrosion. In this manner, heat sinks in accordance with embodiments of the invention maintain high thermal conductivity while featuring long lifetimes in liquid-cooled applications.

Unfortunately, laser heat sinks are typically metallic, and diamond does not easily adhere to most metals, as carbon atoms tend to simply form chemical bonds with the metal atoms rather than forming actual diamond coatings. Various embodiments of the present invention address this challenge via the utilization of specific heat-sink materials and preparation techniques prior to deposition of the diamond coating. In various embodiments, the heat sink includes, consists essentially of, or consists of a metal-matrix composite (or pseudo-alloy) featuring at both (1) one or more thermally conductive metals such as Cu and/or Ag, and (2) one or more refractory metals such as W, Mo, and/or Ti. (In various embodiments, the components of the heat sink, or at least two thereof, are not mutually soluble.) Such composites (e.g., CuW, AgW, AgMo, or CuMo) are generally thermally conductive, and thus are useful thermal-management materials for high-power laser devices. In addition, various ones of these composites tend to be well-matched to laser materials (e.g., GaAs or other semiconductors) in coefficient of thermal expansion (CTE), which improves reliability of these materials when utilized as heat sinks for lasers. (When heat sinks are not well CTE-matched to lasers, the thermal cycling that results from repeated operation can lead to issues such as delamination or poor thermal contact, which compromise the heat-removal characteristics of the heat sink and lead to excessive heating.) As known to those of skill in the art, and as the term is utilized herein, metal-matrix composites (or pseudo-alloys) contain multiple discrete phases (e.g., a thermally conductive phase and a refractory phase), each phase including, consisting essentially of, or consisting of one of the constituents of the composite, as such constituents tend to have little, if any, mutual solubility. For example, one phase may be a matrix phase in which discrete particles of the other phase are dispersed. In various embodiments of the invention, each constituent of a metal-matrix composite has a solubility in the other constituent(s) no greater than approximately 10%, no greater than approximately 8%, no greater than approximately 5%, no greater than approximately 2%, no greater than approximately 1%, no greater than approximately 0.5%, no greater than approximately 0.2%, or no greater than approximately 0.1%. In various embodiments of the invention, each constituent of a metal-matrix composite has a solubility in the other constituent(s) that is approximately equal to 0% (i.e., substantially no solubility).

Heat sinks in accordance with embodiments of the present invention may be free of carbon and/or carbides (e.g., metal carbides and/or ceramic carbides), at least prior to etching and deposition of the diamond film. For example, in embodiments of the invention, no intentional layer or film containing carbon and/or a carbide is deposited or otherwise formed on the heat sink prior to deposition of the diamond film.

In order to facilitate the coating of the metal-matrix composite material with diamond, the heat sink (or one or more portions thereof) is etched with an etchant that removes the thermally conductive component (e.g., Cu) while leaving intact a matrix formed of the refractory component (e.g., W) at the surface of the heat sink. In various embodiments, the thermally conductive component is etched away to a fairly shallow depth (e.g., approximately 1 µm to approximately 10 µm) in order to avoid the formation of excessive porosity in the heat sink that might compromise its thermal conductivity. After the removal of the thermally conductive component, a coating including, consisting essentially of, or consisting of diamond is deposited over the etched surface of the heat sink. The present inventors have found that the surface removal of the thermally conductive component facilitates mechanical and chemical adhesion of the diamond coating to the remaining heat-sink material (via increased adhesion to the porous, etched surface of the heat sink, as well as chemical bonds formed between the carbon of the diamond coating and the refractory component of the heat sink), resulting in strong coatings that resist erosion and corrosion. A beam emitter may subsequently be mounted on the coated heat sink and utilized in a high-power laser system (e.g. a WBC laser system and/or a laser system coupling an input beam into an optical fiber and/or directing a beam to a workpiece for processing thereof).

In various embodiments of the invention, no carburization of the heat sink is performed before or after the etching of the thermally conductive component. As is known in the art, carburization is a heat treatment in the presence of carbon that results in carbon absorption into, e.g., a metal surface. While conventional techniques often utilize carburization to enhance adhesion of carbon-based (e.g., diamond) coatings, embodiments of the present invention require no carburization, and deposition on the etched surface results in diamond coatings having adequate adhesion to the heat sink. Similarly, embodiments of the present invention typically require no deposition or formation of a carbon-containing or carbon-based film on the heat sink prior to deposition of the diamond coating, as mentioned above.

While embodiments of the present invention detailed herein primarily involve the deposition of diamond thin films, other similar films may be utilized in other embodiments of the invention. For example, embodiments of the invention may include the deposition of diamond-like carbon films, i.e., amorphous carbon films having properties similar to those of crystalline diamond films. Such films may be deposited via known techniques without undue experimentation, e.g., utilizing carbon-based precursors (e.g., a gas such as methane) with deposition methods such as sputtering, ion-beam deposition, cathodic arc deposition, or plasma-assisted deposition. While diamond films in accordance with embodiments of the invention are generally crystalline, mixed films that are at least partially crystalline (and, e.g., partially amorphous) are considered to be diamond films in accordance with embodiments of the present invention.

As utilized herein, materials with a high thermal conductivity, or "thermally conductive materials," have a thermal conductivity of at least 100 watts per meter per Kelvin ($W \cdot m^{-1} \cdot K^{-1}$), at least 170 $W \cdot m^{-1} \cdot K^{-1}$, or even at least 300 $W \cdot m^{-1} \cdot K^{-1}$. As utilized herein, materials with a high electrical conductivity, or "electrically conductive materials," have an electrical conductivity, e.g., at 20° C., of at least $1 \times 10^5$ siemens per meter (S/m), at least $1 \times 10^6$ S/m, or even at least $1 \times 10^7$ S/m. As utilized herein, materials with a high electrical resistivity, or "electrically insulating materials," have an electrical resistivity of at least $1 \times 10^8$ ohm·meter ($\Omega \cdot m$), at least $1 \times 10^{10}$ $\Omega \cdot m$, or even at least $1 \times 10^{12}$ $\Omega \cdot m$.

Laser devices in accordance with embodiments of the present invention may be utilized in WBC systems to form high brightness, low beam parameter product (BPP) laser systems. The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, or the "beam quality factor," which is a wavelength-independent measure of beam quality, with the "best" quality corresponding to the "lowest" beam quality factor of 1.

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

A laser diode, such as a laser diode described in the following general description may be used in association with embodiments of the innovations described herein. A laser diode is generally based on a simple diode structure that supports the emission of photons (light). However, to improve efficiency, power, beam quality, brightness, tunability, and the like, this simple structure is generally modified to provide a variety of many practical types of laser diodes. Laser diode types include small edge-emitting varieties that generate from a few milliwatts up to roughly half a watt of output power in a beam with high beam quality. Structural types of diode lasers include double heterostructure lasers that include a layer of low bandgap material sandwiched between two high bandgap layers; quantum well lasers that include a very thin middle layer (quantum well layer) resulting in high efficiency and quantization of the laser's energy; multiple quantum well lasers that include more than one quantum well layer improve gain characteristics; quantum wire or quantum sea (dots) lasers replace the middle layer with a wire or dots that produce higher efficiency quantum well lasers; quantum cascade lasers that enable laser action at relatively long wavelengths that may be tuned by altering the thickness of the quantum layer; separate confinement heterostructure lasers, which are the most common commercial laser diode and include another two layers above and below the quantum well layer to efficiently confine the light produced; distributed feedback lasers, which are commonly used in demanding optical communication applications and include an integrated diffraction grating that facilitates generating a stable wavelength set during manufacturing by reflecting a single wavelength back to the gain region; vertical-cavity surface-emitting lasers (VCSELs), which have a different structure that other laser diodes in that light is emitted from its surface rather than from its edge; and vertical-external-cavity surface-emitting-laser (VECSELs) and external-cavity diode lasers, which are tunable lasers that use mainly double heterostructure diodes and include gratings or multiple-prism grating configurations. External-cavity diode lasers are often wavelength-tunable and exhibit a small emission line width. Laser diode types also include a variety of high power diode-based lasers including: broad area lasers that are characterized by multi-mode diodes with oblong output facets and generally have poor beam quality but generate a few watts of power; tapered lasers that are characterized by astigmatic mode diodes with tapered output facets that exhibit improved beam quality and brightness when compared to broad area lasers; ridge waveguide lasers that are characterized by elliptical mode diodes with oval output facets; and slab-coupled optical waveguide lasers (SCOWL) that are characterized by circular mode diodes with output facets and may generate watt-level output in a diffraction-limited beam with nearly a circular profile.

Laser diode arrays, bars and/or stacks, such as those described in the following general description may be used in association with embodiments of the innovations described herein. Laser diodes may be packaged individually or in groups, generally in one-dimensional rows/arrays (diode bars) or two dimensional arrays (diode-bar stacks). A diode array stack is generally a vertical stack of diode bars. Laser diode bars or arrays generally achieve substantially higher power, and cost effectiveness than an equivalent single broad area diode. High-power diode bars generally contain an array of broad-area emitters, generating tens of watts with relatively poor beam quality; despite the higher power, the brightness is often lower than that of a broad area laser diode. High-power diode bars may be stacked to produce high-power stacked diode bars for generation of extremely high powers of hundreds or thousands of watts. Laser diode arrays may be configured to emit a beam into free space or into a fiber. Fiber-coupled diode-laser arrays may be conveniently used as a pumping source for fiber lasers and fiber amplifiers.

A diode-laser bar is a type of semiconductor laser containing a one-dimensional array of broad-area emitters or alternatively containing sub arrays containing, e.g., 10-20 narrow stripe emitters. A broad-area diode bar typically contains, for example, 19-49 emitters, each having dimensions on the order of, e.g., 1 µm×100 µm. The beam quality along the 1 µm dimension or fast-axis is typically diffraction-limited. The beam quality along the 100 µm dimension or slow-axis or array dimension is typically many times diffraction-limited. Typically, a diode bar for commercial applications has a laser resonator length of the order of 1 to 4 mm, is about 10 mm wide and generates tens of watts of output power. Most diode bars operate in the wavelength region from 780 to 1070 nm, with the wavelengths of 808 nm (for pumping neodymium lasers) and 940 nm (for pumping Yb:YAG) being most prominent. The wavelength range of 915-976 nm is used for pumping erbium-doped or ytterbium-doped high-power fiber lasers and amplifiers.

A property of diode bars that is usually addressed is the output spatial beam profile. For most applications beam conditioning optics are needed. Significant efforts are therefore often required for conditioning the output of a diode bar or diode stack. Conditioning techniques include using aspherical lenses for collimating the beams while preserving the beam quality. Micro optic fast axis collimators may be used to collimate the output beam along the fast-axis. Arrays of aspherical cylindrical lenses are often used for collimation of each laser element along the array or slow-axis. To achieve beams with approximately circular beam waist, a special beam shaper for symmetrization of the beam quality of each diode bar or array can be applied. A degrading property of diode bars is the "smile"—a slight bend of the planar nature of the connected emitters. Smile errors may have detrimental effects on the ability to focus beams from diode bars. Another degrading property is collimation error of the slow- and fast-axis. For example, a twisting of the fast-axis collimation lens results in an effective smile. This has detrimental effects on the ability to focus. In stacks, "pointing" error of each bar is often the most dominant effect. Pointing error is a collimation error and is the result of the array or bar that is offset from the fast-axis lens. An offset of 1 µm is the same as the whole array having a smile of 1 µm.

Diode bars and diode arrays overcome limitations of very broad single emitters, such as amplified spontaneous emission or parasitic lasing in the transverse direction or filament formation. Diode arrays may also be operated with a more stable mode profile, because each emitter produces its own beam. Techniques which exploit some degree of coherent coupling of neighbored emitters may result in better beam quality. Such techniques may be included in the fabrication of the diode bars while others may involve external cavities. Another benefit of diode arrays is that the array geometry makes diode bars and arrays very suitable for coherent or spectral beam combining to obtain a much higher beam quality.

In addition to raw bar or array offerings, diode arrays are available in fiber-coupled form because this often makes it much easier to utilize each emitter's output and to mount the diode bars so that cooling of the diodes occurs some distance from the place where the light is used. Usually, the light is coupled into a single multimode fiber, using either a simple fast-axis collimator without beam conditioning in the slow-axis direction, or a more complex beam shaper to better preserve the brightness. It is also possible to launch the beamlets from the emitters into a fiber bundle (with one fiber per emitter). Emission bandwidth of a diode bar or diode array is an important consideration for some applications. Optical feedback (e.g. from volume Bragg grating) can significantly improve wavelength tolerance and emission bandwidth. In addition, bandwidth and exact center wavelength may also be important for spectral beam combining.

A diode stack is simply an arrangement of multiple diode bars that can deliver very high output power. Also called diode laser stack, multi-bar module, or two-dimensional laser array, the most common diode stack arrangement is that of a vertical stack which is effectively a two-dimensional array of edge emitters. Such a stack may be fabricated by attaching diode bars to thin heat sinks and stacking these assemblies so as to obtain a periodic array of diode bars and heat sinks. There are also horizontal diode stacks, and two-dimensional stacks. For high beam quality, the diode bars generally should be as close to each other as possible. On the other hand, efficient cooling requires some minimum thickness of the heat sinks mounted between the bars. This tradeoff of diode bar spacing results in beam quality of a diode stack in the vertical direction (and subsequently its brightness) much lower than that of a single diode bar. There are, however, several techniques for significantly mitigating this problem, e.g., by spatial interleaving of the outputs of different diode stacks, by polarization coupling, or by wavelength multiplexing. Various types of high-power beam shapers and related devices have been developed for such purposes. Diode stacks may provide extremely high output powers (e.g. hundreds or thousands of watts).

In an aspect, embodiments of the invention feature a method of heat sink preparation. A heat sink is provided. The heat sink includes, consists essentially of, or consists of a metal-matrix composite of at least one thermally conductive metal and at least one refractory metal. At least a portion of a surface of the heat sink is etched to form thereon a depleted region. The depleted region may include, consist essentially of, or consist of the refractory metal. The depleted region may be substantially free of the thermally conductive metal. A coating is deposited over at least a portion of the depleted region. The coating includes, consists essentially of, or consists of diamond.

Embodiments of the invention may include one or more of the following in any of a variety of combinations. The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The coating may be deposited by chemical vapor deposition or physical vapor deposition (e.g., sputtering, evaporation). The thickness of the depleted region may range from approximately 1 μm to approximately 10 μm, from approximately 0.5 μm to approximately 20 μm, from approximately 2 μm to approximately 5 μm, or from approximately 5 μm to approximately 15 μm. The thickness of the coating may range from approximately 5 μm to approximately 20 μm, from approximately 1 μm to approximately 10 μm, from approximately 0.5 μm to approximately 20 μm, from approximately 2 μm to approximately 5 μm, or from approximately 5 μm to approximately 15 μm. The at least a portion of the surface of the heat sink may be etched using a solution including, consisting essentially of, or consisting of (i) ferric chloride, (ii) acetic acid and hydrogen peroxide, and/or (iii) hydrochloric acid and hydrogen peroxide. The solution may contain water (e.g., deionized water) and/or another diluent. The at least a portion of the surface of the heat sink (or at least part of it) may be disposed within a conduit internal to the heat sink. The heat sink may include a fluid inlet and a fluid outlet. The at least a portion of the surface of the heat sink may be disposed in a portion of the heat sink fluidly coupled to the fluid inlet and the fluid outlet. A beam emitter may be thermally coupled to the heat sink. The beam emitter may be placed in direct mechanical contact with the heat sink. A thermal bonding material may be disposed between the beam emitter and the heat sink. A first portion of the surface of the heat sink may be etched. A second portion of the surface of the heat sink may be masked to prevent etching thereof prior to etching the first portion of the surface of the heat sink. At least a portion of the depleted region may be roughened prior to deposition of the coating.

In another aspect, embodiments of the invention feature a method of heat sink preparation. A heat sink is provided. The heat sink includes, consists essentially of, or consists of a metal-matrix composite of a thermally conductive metal and a refractory metal. The heat sink contains the thermally conductive metal at a first concentration. At least a portion of a surface of the heat sink is etched to deplete at least a portion of the thermally conductive metal therefrom, thereby forming on the at least a portion of the surface a depleted region. The depleted region includes, consists essentially of, or consists of the refractory metal. A coating is deposited over at least a portion of the depleted region. The coating includes, consists essentially of, or consists of diamond.

Embodiments of the invention may include one or more of the following in any of a variety of combinations. The depleted region may include the thermally conductive metal at a second concentration lower than the first concentration. The concentration of the thermally conductive metal in the depleted region may increase in a direction away from the surface of the heat sink. The depleted region may be substantially free of the thermally conductive metal. The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The coating may be deposited by chemical vapor deposition or physical vapor deposition (e.g., sputtering, evaporation). The thickness of the depleted region may range from approximately 1 μm to approximately 10 μm, from approximately 0.5 μm to approximately 20 μm, from approximately 2 μm to approximately 5 μm, or from approximately 5 μm to approximately 15 μm. The thickness of the coating may range from approximately 5 μm to approximately 20 μm, from approximately 1 μm to approximately 10 μm, from approximately 0.5 μm to approximately 20 μm, from approximately 2 μm to approximately 5 μm, or from approximately 5 μm to approximately 15 μm. The at least a portion of the surface of the heat sink may be etched using a solution including, consisting essentially of, or consisting of (i) ferric chloride, (ii) acetic acid and hydrogen peroxide, and/or (iii) hydrochloric acid and hydrogen peroxide. The solution may contain water (e.g., deionized water) and/or another diluent. The at least a portion of the surface of the heat sink (or at least part of it) may be disposed within a conduit internal to the heat sink. The heat sink may include a fluid inlet and a fluid outlet. The at least a portion of the surface of the heat sink may be disposed in a portion of the heat sink fluidly coupled to the fluid inlet and the fluid outlet. A beam emitter may be thermally coupled to the heat sink. The beam emitter may be placed in direct mechanical contact with the heat sink. A thermal bonding material may be disposed between the beam emitter and the heat sink. A first portion of the surface of the heat sink may be etched. A second portion of the surface of the heat sink may be masked to prevent etching thereof prior to etching the first portion of the surface of the heat sink. At least a portion of the depleted region may be roughened prior to deposition of the coating.

In yet another aspect, embodiments of the invention feature a heat sink that includes, consists essentially of, or consists of a body, a depleted region, and a coating. The body includes, consists essentially of, or consists of a metal-matrix composite of a thermally conductive metal and a refractory metal. The body may be configured (e.g., sized and shaped) to be thermally coupled to and/or otherwise receive or support a beam emitter. The depleted region is disposed over and/or within at least a portion of a surface of the body. The depleted region includes, consists essentially of, or consists of the refractory metal. The depleted region may be substantially free of the thermally conductive metal.

The coating is disposed within and/or over the depleted region. The coating includes, consists essentially of, or consists of diamond.

Embodiments of the invention may include one or more of the following in any of a variety of combinations. The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The thickness of the depleted region may range from approximately 1 μm to approximately 10 μm, from approximately 0.5 μm to approximately 20 μm, from approximately 2 μm to approximately 5 μm, or from approximately 5 μm to approximately 15 μm. The thickness of the coating may range from approximately 5 μm to approximately 20 μm, from approximately 1 μm to approximately 10 μm, from approximately 0.5 μm to approximately 20 μm, from approximately 2 μm to approximately 5 μm, or from approximately 5 μm to approximately 15 μm. The body of the heat sink may define a conduit therewithin. The depleted region may be disposed over and/or within at least a portion of the conduit internal to the heat sink. The body of the heat sink may define a fluid inlet and a fluid outlet therein. The depleted region may be disposed over and/or within a portion of the body fluidly coupled to the fluid inlet and the fluid outlet. A beam emitter may be thermally coupled to the body. The beam emitter may be disposed in direct mechanical contact with the body. A thermal bonding material may be disposed between the beam emitter and the body. The beam emitter may include, consist essentially of, or consist of a diode bar configured to emit a plurality of discrete beams. At least two (or even all) of the beams may have different wavelengths.

In another aspect, embodiments of the invention feature a wavelength beam combining laser system that includes, consists essentially of, or consists of a beam emitter, focusing optics, a dispersive element, a partially reflective output coupler, and a heat sink. The beam emitter is configured to emit a plurality of discrete beams. Two or more (or even all) of the beams may have different wavelengths. The focusing optics at least partially overlap the plurality of beams onto the dispersive element. The dispersive element receives and disperses the received focused beams. The partially reflective output coupler is positioned to receive the dispersed beams, transmit a portion of the dispersed beams therethrough as a multi-wavelength output beam, and reflect a second portion of the dispersed beams back toward the dispersive element (e.g., back to the dispersive element and thence back to the beam emitter). The heat sink is thermally coupled to the beam emitter. The beam emitter may be disposed in direct mechanical contact with the heat sink. A thermal bonding material may be disposed between the beam emitter and the heat sink. The heat sink includes, consists essentially of, or consists of a body, a depleted region disposed over and/or within at least a portion of a surface of the body, and a coating disposed within and/or over the depleted region. The body includes, consists essentially of, or consists of a metal-matrix composite of a thermally conductive metal and a refractory metal. The depleted region includes, consists essentially of, or consists of the refractory metal. The depleted region may be substantially free of the thermally conductive metal. The coating includes, consists essentially of, or consists of diamond.

Embodiments of the invention may include one or more of the following in any of a variety of combinations. The dispersive element may include, consist essentially of, or consist of a diffraction grating (e.g., a transmissive diffraction grating or a reflective diffraction grating). The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The thickness of the depleted region may range from approximately 1 μm to approximately 10 μm, from approximately 0.5 μm to approximately 20 μm, from approximately 2 μm to approximately 5 μm, or from approximately 5 μm to approximately 15 μm. The thickness of the coating may range from approximately 5 μm to approximately 20 μm, from approximately 1 μm to approximately 10 μm, from approximately 0.5 μm to approximately 20 μm, from approximately 2 μm to approximately 5 μm, or from approximately 5 μm to approximately 15 μm. The body of the heat sink may define a conduit therewithin. The depleted region may be disposed over and/or within at least a portion of the conduit internal to the heat sink. The body of the heat sink may define a fluid inlet and a fluid outlet therein. The depleted region may be disposed over and/or within a portion of the body fluidly coupled to the fluid inlet and the fluid outlet.

In yet another aspect, embodiments of the invention feature a heat sink that includes, consists essentially of, or consists of a body, a depleted region, and a coating. The body includes, consists essentially of, or consists of a metal-matrix composite of a thermally conductive metal and a refractory metal. The body may be configured (e.g., sized and shaped) to be thermally coupled to and/or otherwise receive or support a beam emitter. The body contains the thermally conductive metal at a first (non-zero) concentration. The depleted region is disposed over and/or within at least a portion of a surface of the body. The depleted region includes, consists essentially of, or consists of the refractory metal. The coating is disposed within and/or over the depleted region. The coating includes, consists essentially of, or consists of diamond.

Embodiments of the invention may include one or more of the following in any of a variety of combinations. The depleted region may include the thermally conductive metal at a second (non-zero) concentration lower than the first concentration. The concentration of the thermally conductive metal in the depleted region may increase in a direction away from the surface of the body. The depleted region may be substantially free of the thermally conductive metal. The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The thickness of the depleted region may range from approximately 1 μm to approximately 10 μm, from approximately 0.5 μm to approximately 20 μm, from approximately 2 μm to approximately 5 μm, or from approximately 5 μm to approximately 15 μm. The thickness of the coating may range from approximately 5 μm to approximately 20 μm, from approximately 1 μm to approximately 10 μm, from approximately 0.5 μm to approximately 20 μm, from approximately 2 μm to approximately 5 μm, or from approximately 5 μm to approximately 15 μm. The body of the heat sink may define a conduit therewithin. The depleted region may be disposed over and/or within at least a portion of the conduit internal to the heat sink. The body of the heat sink may define a fluid inlet and a fluid outlet therein. The depleted region may be disposed over and/or within a portion of the body fluidly coupled to the fluid inlet and the fluid outlet. A beam emitter may be thermally coupled to the body. The beam emitter may be disposed in direct mechanical contact with the body. A thermal bonding material may be disposed between the beam emitter and the body. The beam emitter may include, consist essentially of, or consist of a diode bar configured to emit a plurality of discrete beams. At least two (or even all) of the beams may have different wavelengths.

In another aspect, embodiments of the invention feature a wavelength beam combining laser system that includes, consists essentially of, or consists of a beam emitter, focusing optics, a dispersive element, a partially reflective output coupler, and a heat sink. The beam emitter is configured to emit a plurality of discrete beams. Two or more (or even all) of the beams may have different wavelengths. The focusing optics at least partially overlap the plurality of beams onto the dispersive element. The dispersive element receives and disperses the received focused beams. The partially reflective output coupler is positioned to receive the dispersed beams, transmit a portion of the dispersed beams therethrough as a multi-wavelength output beam, and reflect a second portion of the dispersed beams back toward the dispersive element (e.g., back to the dispersive element and thence back to the beam emitter). The heat sink is thermally coupled to the beam emitter. The beam emitter may be disposed in direct mechanical contact with the heat sink. A thermal bonding material may be disposed between the beam emitter and the heat sink. The heat sink includes, consists essentially of, or consists of a body, a depleted region disposed over and/or within at least a portion of a surface of the body, and a coating disposed within and/or over the depleted region. The body includes, consists essentially of, or consists of a metal-matrix composite of a thermally conductive metal and a refractory metal. The body contains the thermally conductive metal at a first (non-zero) concentration. The depleted region includes, consists essentially of, or consists of the refractory metal. The coating includes, consists essentially of, or consists of diamond.

Embodiments of the invention may include one or more of the following in any of a variety of combinations. The dispersive element may include, consist essentially of, or consist of a diffraction grating (e.g., a transmissive diffraction grating or a reflective diffraction grating). The depleted region may include the thermally conductive metal at a second (non-zero) concentration lower than the first concentration. The concentration of the thermally conductive metal in the depleted region may increase in a direction away from the surface of the body. The depleted region may be substantially free of the thermally conductive metal. The thermally conductive metal may include, consist essentially of, or consist of Cu and/or Ag. The refractory metal may include, consist essentially of, or consist of W, Mo, and/or Ti. The thermally conductive metal may include, consist essentially of, or consist of Cu, and the refractory metal may include, consist essentially of, or consist of W. The thickness of the depleted region may range from approximately 1 µm to approximately 10 µm, from approximately 0.5 µm to approximately 20 µm, from approximately 2 µm to approximately 5 µm, or from approximately 5 µm to approximately 15 µm. The thickness of the coating may range from approximately 5 µm to approximately 20 µm, from approximately 1 µm to approximately 10 µm, from approximately 0.5 µm to approximately 20 µm, from approximately 2 µm to approximately 5 µm, or from approximately 5 µm to approximately 15 µm. The body of the heat sink may define a conduit therewithin. The depleted region may be disposed over and/or within at least a portion of the conduit internal to the heat sink. The body of the heat sink may define a fluid inlet and a fluid outlet therein. The depleted region may be disposed over and/or within a portion of the body fluidly coupled to the fluid inlet and the fluid outlet.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the terms "approximately," "about," and "substantially" mean±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 4A is a schematic view of a heat sink in accordance with various embodiments of the invention;

FIG. 4B is a magnified view of a portion of the heat sink of FIG. 4A;

FIG. 4C depicts the portion of FIG. 4B after etching treatment in accordance with various embodiments of the invention;

FIG. 4D depicts the portion of FIG. 4C after film deposition in accordance with various embodiments of the invention;

DETAILED DESCRIPTION

Figure 1:
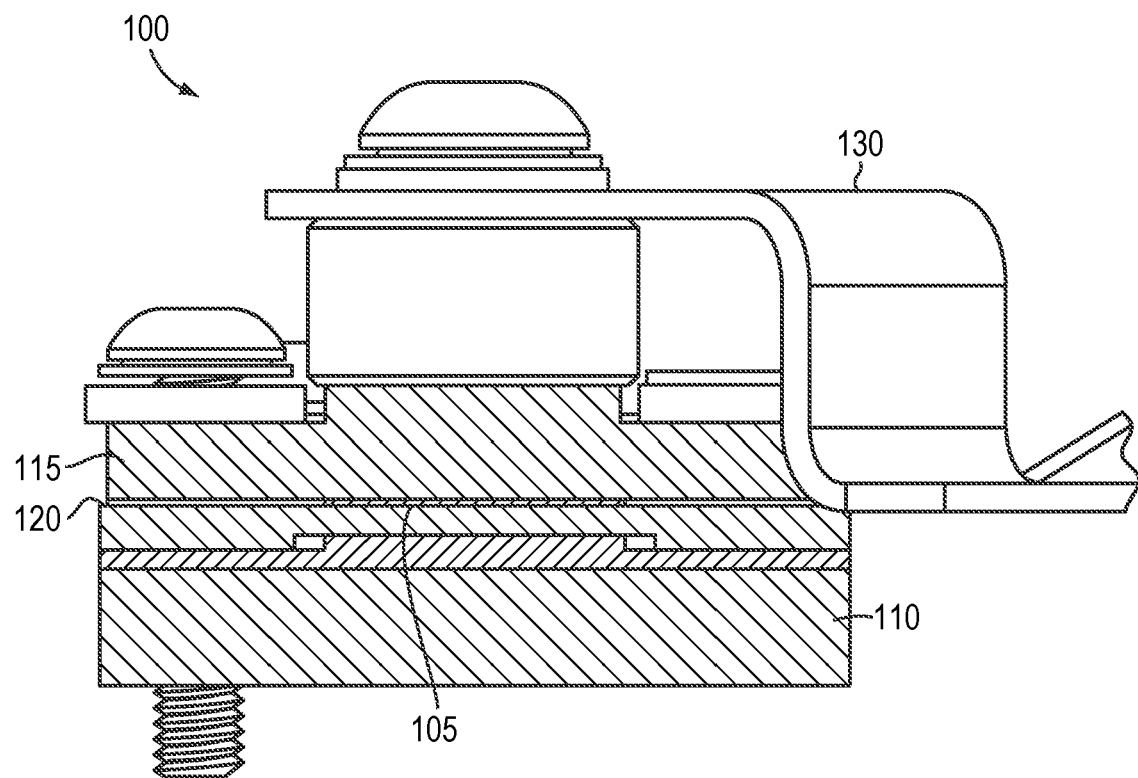
FIGS. 1 and 2 are, respectively, a side view and a perspective view of a packaged laser in accordance with various of the invention.
Figure 2:
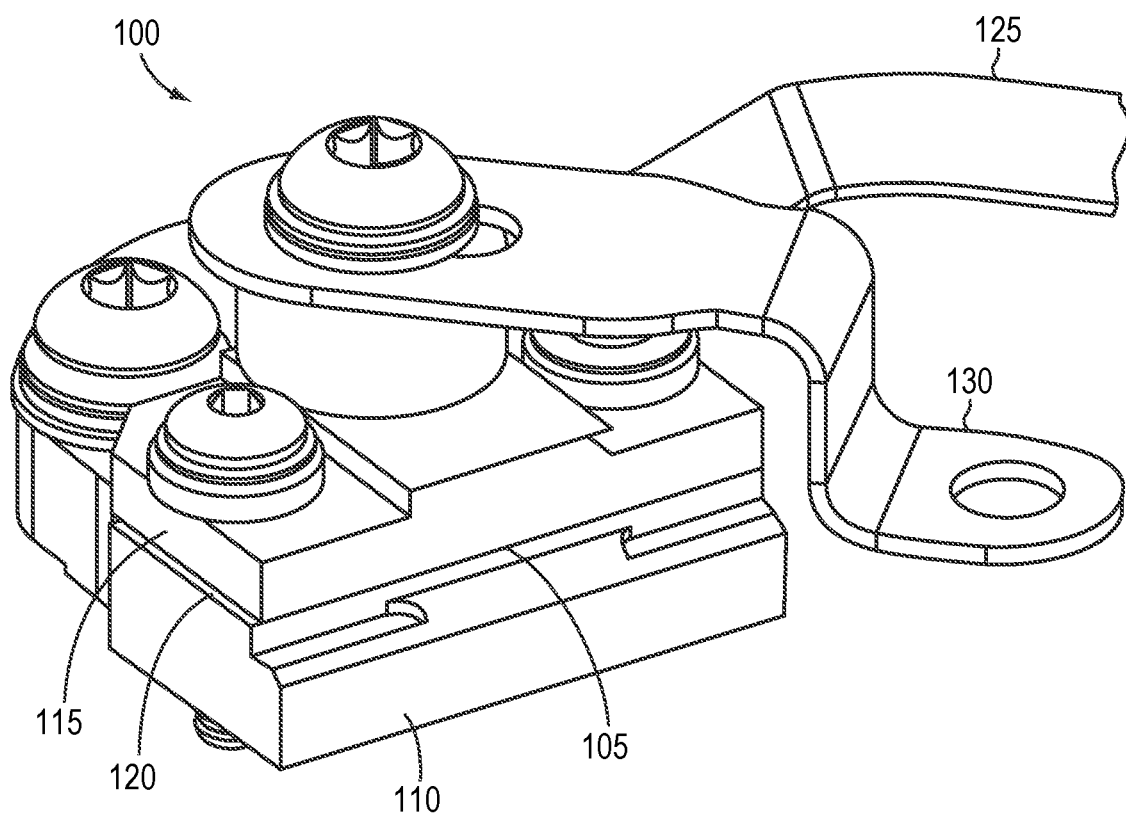

FIGS. 1 and 2 depict portions of an exemplary packaged laser 100 in accordance with embodiments of the present invention. As shown, the laser 100 includes a beam emitter 105 sandwiched between two electrode mounts 110, 115. The beam emitter 105 may include or consist essentially of, e.g., a laser diode, a diode bar, an array of laser diodes, an array of diode bars, or one or more vertical cavity surface-emitting lasers (VCSELs). The electrode mounts 110, 115 are thermally connected to the beam emitter 105 and each electrically connected to one of the electrodes (i.e., the anode and the cathode) of the beam emitter 105. For example, the electrode mount 110 may be electrically connected to the anode of beam emitter 105 and the electrode mount 115 may be electrically connected to the cathode of beam emitter 105, or vice versa. The electrode mounts 110, 115 are typically highly thermally and electrically conductive. An insulating layer 120 is disposed around the beam emitter 105 and between the electrode mounts 110, 115, thereby electrically isolating the electrode mounts 110, 115 from each other (other than any conductive path established through the beam emitter 105 itself). As shown, the electrode mounts 110, 115 may be fastened together and to the beam emitter 105 via, e.g., one or more fasteners such as screws, which may also attach the electrode mounts to a housing (as detailed below). Conductive contacts 125, 130 are connected to and extend from the electrode mounts 110, 115 in order to facilitate interconnection of the laser 100 to, for example, other laser devices (in series or in parallel) or to a source of electrical power (e.g., a current source). Laser 100 may also incorporate one or more features described in, and/or be fabricated in accordance with, U.S. Pat. No. 9,178,333, filed on Mar. 24, 2015, the entire disclosure of which is incorporated herein by reference.

Figure 3:
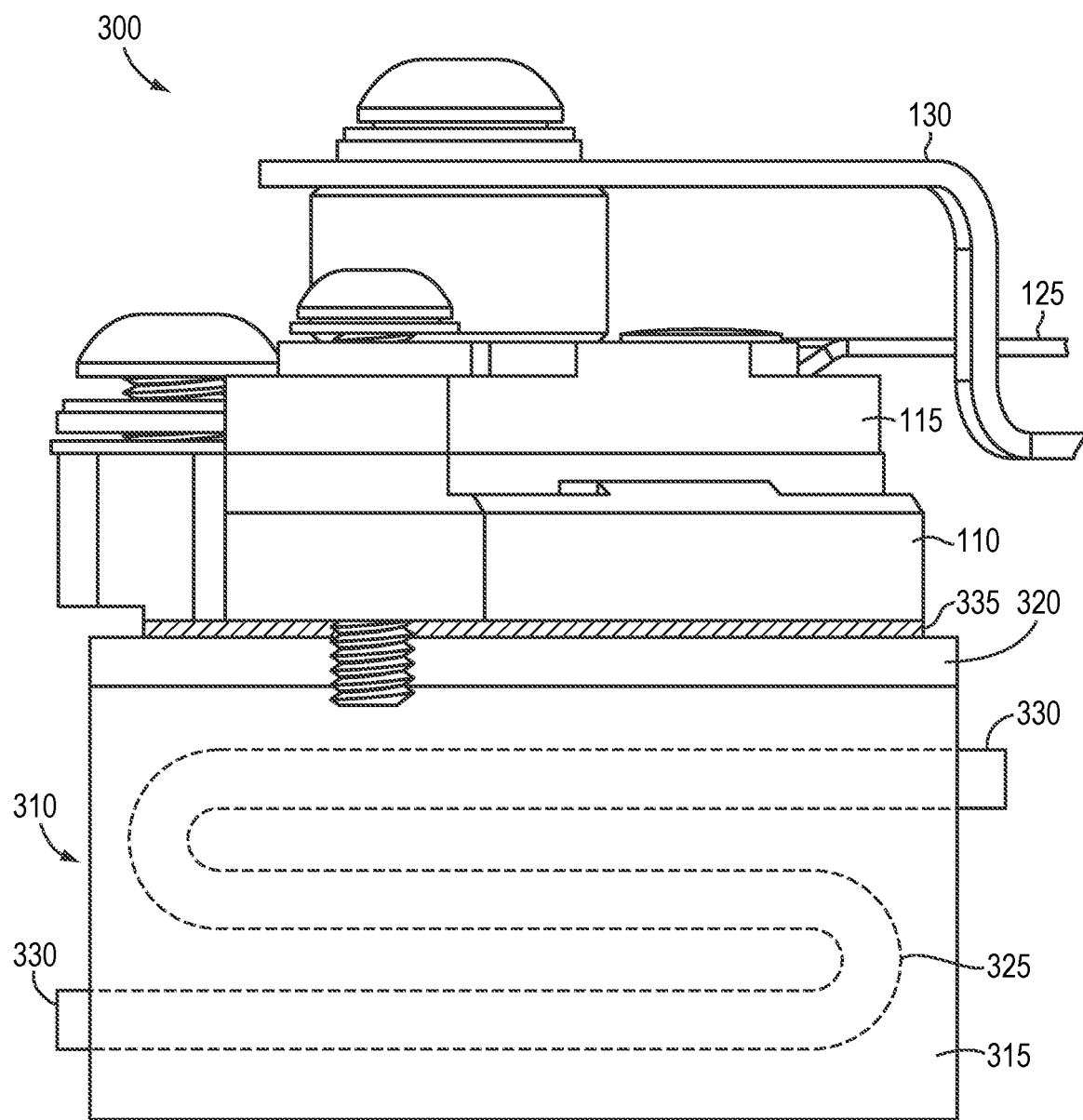
FIG. 3 is a side view of a packaged laser in accordance with various embodiments of the invention.

FIG. 3 depicts a laser device 300 in which one or both electrode mounts 110, 115 are fastened or affixed to a thermally conductive housing 310. The housing 310 may include or consist essentially of a housing body 315 capped with an insulating layer 320 that retards or substantially prevents electrical conduction between the electrode mount 110 and the housing body 315 while maintaining thermal conductivity therebetween. For example, the insulating layer 320 may include, consist essentially of, or consist of aluminum nitride, boron arsenide, diamond, and/or beryllium oxide. In some embodiments, the insulating layer 320 may not be present. The housing body 315 may include, consist essentially of, or consist of one or more thermally conductive materials. As shown in FIG. 3, the housing body 315 may also incorporate therewithin one or more cooling channels 325 through which a coolant (e.g., a liquid such as water) may flow to remove heat from the housing body. A coolant source and coolant sink may be connected to the cooling channel 325 via coolant interconnections 330. A coolant reservoir and, e.g., a heat exchanger, may be fluidly connected to the cooling channel 325 and provide coolant thereto. Such cooling systems are conventional and may be utilized with embodiments of the present invention without undue experimentation.

In some embodiments, a thermal bonding layer 335 is utilized to enhance contact (and thus thermal conduction) between the electrode mount 110 and the housing 310, even if the insulating layer 320 has a rough surface. The thermal bonding layer 335 may include, consist essentially of, or consist of, for example, a thermal bonding material such as a thermally conductive solder, foil, liquid, paste, or gel material such as indium (e.g., indium paste or solder) or silver paste. The thickness of the thermal bonding layer 335 may be, for example, between approximately 0.5 μm and approximately 150 μm. The thickness of the insulating layer 320 may be, for example, between approximately 5 μm and approximately 150 μm. In various embodiments, a thermal bonding layer 335 may also be present between the beam emitter 105 and one or both of the electrode mounts 110, 115. Thermal bonding layers 335 and/or portions of components in contact therewith may be sealed with a sealing material to minimize or prevent creep of the thermal bonding layer 335, for example as described in U.S. patent application Ser. No. 15/006,733, filed Jan. 26, 2016, the entire disclosure of which is incorporated by reference herein. Thermal bonding layers and laser devices in accordance with embodiments of the invention may also incorporate one or more structures or systems for inhibiting movement of thermal bonding material as described in U.S. patent application Ser. No. 15/006,693, filed Jan. 26, 2016, the entire disclosure of which is incorporated by reference herein.

In accordance with embodiments of the present invention, heat sinks (e.g., electrode mounts and/or housing) are coated, substantially completely or in part, with a diamond coating that enables heat conduction but provides mechanical strength and resistance to erosion and corrosion. In various embodiments, the heat sink includes, consists essentially of, or consists of a metal-matrix composite (or pseudo-alloy) featuring at both (1) one or more thermally conductive metals such as Cu and/or Ag, and (2) one or more refractory metals such as W, Mo, and/or Ti. One exemplary metal-matrix composite utilized in embodiments of the present invention is CuW, which may contain, for example, between approximately 70% and approximately 80% W in order to provide CTE matching with various types of beam emitters (or other semiconductor devices). Various embodiments of the invention may feature other thermally conductive metals such as Al and/or Au, and/or other refractory metals such as Nb, Ta, Re, Zr, Hf, Ru, Os, Ir, and/or Rh.

FIGS. 4A and 4B schematically depict a heat sink 400 that (at least in part) includes, consists essentially of, or consists of a metal-matrix composite containing a discrete thermally conductive phase 410 (that includes, consists essentially of, or consist of the one or more thermally conductive metals) and a discrete refractory phase 420 (that includes, consists essentially of, or consists of the one or more refractory metals). (While there may, in some embodiments, be intermixing present at the interface(s) between the phases 410, 420, typically the discrete phase regions themselves will include, consist essentially of, or consist of their metal at a concentration greater than approximately 75%, greater than approximately 80%, greater than approximately 85%, greater than approximately 90%, greater than approximately 95%, greater than approximately 97%, greater than approximately 99%, or greater than approximately 99.5%.)

In order to facilitate the coating of the heat sink 400 with diamond, the heat sink 400 (or one or more portions thereof) is etched with an etchant that removes the thermally conductive phase 410 (e.g., Cu) while leaving intact (or substantially intact, i.e., some portion of the matrix may be removed, but the remaining surface includes, consists essentially of, or consists of at least 75%, at least 80%, at least 85%, at least 90%, at least 95%, at least 97%, or at least 99% of the matrix, rather than the thermally conductive phase) a matrix formed of the refractory phase 420 (e.g., W) at the surface of the heat sink 400. As shown in FIG. 4C, the etching process typically leaves a surface porous region 430 that includes, consists essentially of, or consists of the refractory phase 420 and is substantially free of the thermally conductive phase 410 (e.g., contains no more than 10%, no more than 5%, no more than 2%, no more than 1%, or no more than 0.5% of the thermally conductive phase 410). In various embodiments, the thermally conductive phase 410 is etched away to a fairly shallow depth (e.g., approximately 1 μm to approximately 10 μm, or to any depth therebetween) in order to avoid the formation of excessive porosity in the heat sink 400 that might compromise its thermal conductivity. After the removal of the thermally conductive phase 420 and formation of the porous region 430, a coating 440 including, consisting essentially of, or consisting of diamond (or, in some embodiments, diamond-like carbon) is deposited over the etched surface of the heat sink 400, as shown in FIG. 4D.

Figure 4E:
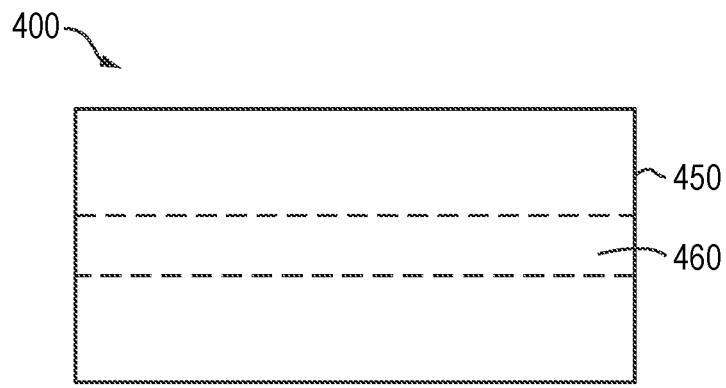
FIG. 4E is a schematic view of a heat sink in accordance with various embodiments of the invention.

FIG. 4E schematically depicts another exemplary heat sink 400, which may correspond to, for example, an electrode mount 110, 115 or a housing 310, or other heat sink for heat removal from a beam emitter. As shown, heat sink 400 has an outer surface 450 and may incorporate one or more internal conduits 460 for the conduction therethrough of a liquid coolant (e.g., water). While FIG. 4E depicts conduit 460 as a simple linear conduit, embodiments of the invention include conduits and conduit networks that include complex features such as turns, branches, etc. In accordance with embodiments of the invention, all or a portion of one or more of the exposed exterior or interior (e.g., within a conduit) surfaces of heat sink 400 are etched to remove one or more constituents of the heat-sink material and facilitate formation and adhesion of a diamond coating thereon. In an embodiment, the heat sink 400 is immersed in a liquid etchant that preferentially etches the thermally conductive phase (e.g., Cu) while leaving intact a matrix formed of the refractory phase (e.g., W) at the surface of the heat sink 400. For example, the etchant may include, consist essentially of, or consist of ferric chloride, a mixture of acetic acid and hydrogen peroxide, or a mixture of hydrochloric acid and hydrogen peroxide. In various embodiments, the etchant may be applied by, e.g., spraying, rather than by immersion of the heat sink 400 in the etchant. In various embodiments, only one or more portions of the exposed (internal and/or external) surfaces of the heat sink 400 may be etched, and remaining the portion(s) may be masked with a masking material resistant to the etchant being applied.

Figure 4F:
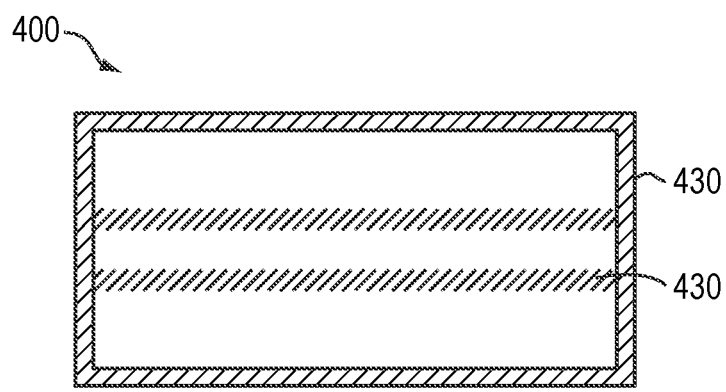
FIG. 4F depicts the heat sink of FIG. 4E after etching treatment in accordance with various embodiments of the invention.

As shown in FIG. 4F, the etch process forms porous (or "depleted") region 430 on the one or more etched surfaces of the heat sink 400, as also shown in FIG. 4C. As mentioned above, the depleted region 430, at least at it surface is substantially free of the thermally conductive phase (e.g., Cu) of the heat sink 400, and thus at least a portion of the depleted region 430 includes, consists essentially of, or consists of only the refractory phase (e.g., W) of the heat sink. In some embodiments, while the surface portion (e.g., to a depth of 0.1 μm to 1 μm) is substantially free of the thermally conductive phase, all or part of the remainder of the depleted region 430 contains some amount of that phase, albeit at a lower concentration than is present in the unetched bulk of the heat sink 400. In various embodiments, this lesser amount of the thermally conductive phase may even be graded in composition, increasing in composition toward the interior (i.e., the unetched bulk) of the heat sink 400.

The etch process may be continued for a sufficient time such that the depth of the depleted region 430 ranges from, for example, approximately 1 μm to approximately 10 μm. In various embodiments, after etching, the depleted region 430 may be abraded or roughened (e.g., via abrasion with an agent containing, including, consisting essentially of, or consisting of a fine abrasive powder (e.g., diamond, SiC, or other hard material)) in order to enhance adhesion of subsequently deposited diamond films thereon. In various other embodiments, no such additional abrasion step is utilized or required.

Figure 4G:
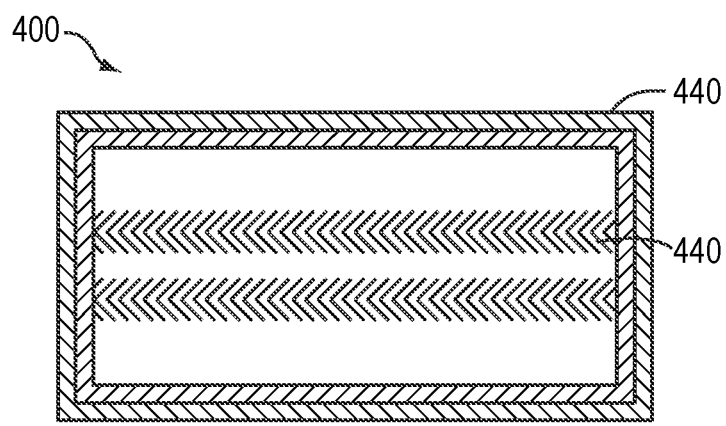
FIG. 4G depicts the heat sink of FIG. 4F after film deposition in accordance with various embodiments of the invention.

As shown in FIG. 4G, after formation of the depleted region 430, a diamond coating 440 is deposited over the heat sink 400. Advantageously, the lack of the thermally conductive phase (as well as, in various embodiments, the porous structure of the etched surface) within the depleted region 430 facilitates formation and adhesion of the diamond coating 440 on the heat sink 400. In various embodiments, the diamond coating 440 has a thickness of, for example, approximately 5 μm to approximately 50 μm. In various embodiments, the diamond coating 440 has a thickness of greater than approximately 20 μm. In various embodiments, the diamond coating 440 has a thickness sufficient to close or cover any pinholes or porosity in the diamond coating 440 that might compromise its corrosion resistance.

The diamond coating 440 may be deposited via known techniques without undue experimentation. In various embodiments, the diamond coating 440 is deposited by chemical vapor deposition (CVD), for example plasma-enhanced CVD or hot-filament CVD. In various embodiments, the deposition temperature of the diamond coating 440 is sufficiently low to prevent evaporation or melting of any of the remaining thermally conductive component of the heat sink 400, which typically has a melting point lower than that of the refractory component. Thus, in various embodiments the deposition temperature is less than approximately 900° C., e.g., between approximately 700° and approximately 900° C. The diamond coating 440 may be deposited using precursors that include, consist essentially of, or consist of a source of hydrogen (e.g., hydrogen gas) and a source of carbon (e.g., a gas such as methane). In embodiments utilizing plasma-enhanced CVD, a plasma of at least one of the precursors may be formed via, e.g., radio frequency (RF) (alternating current (AC)) frequency or direct current (DC) discharge between two electrodes within the deposition reactor. After deposition of the diamond coating 440, the heat sink 400 may be coupled to a beam emitter and/or exposed to stagnant and/or flowing liquid coolant (e.g., water) for thermal management.

Figure 5A:
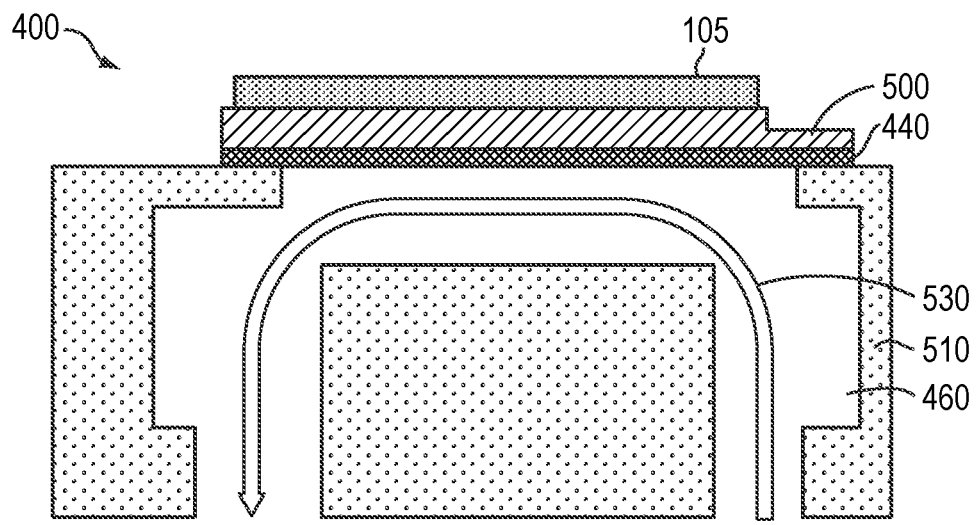
FIGS. 5A and 5B are cross-sectional schematics of heat sinks in accordance with various embodiments of the invention.
Figure 5B:
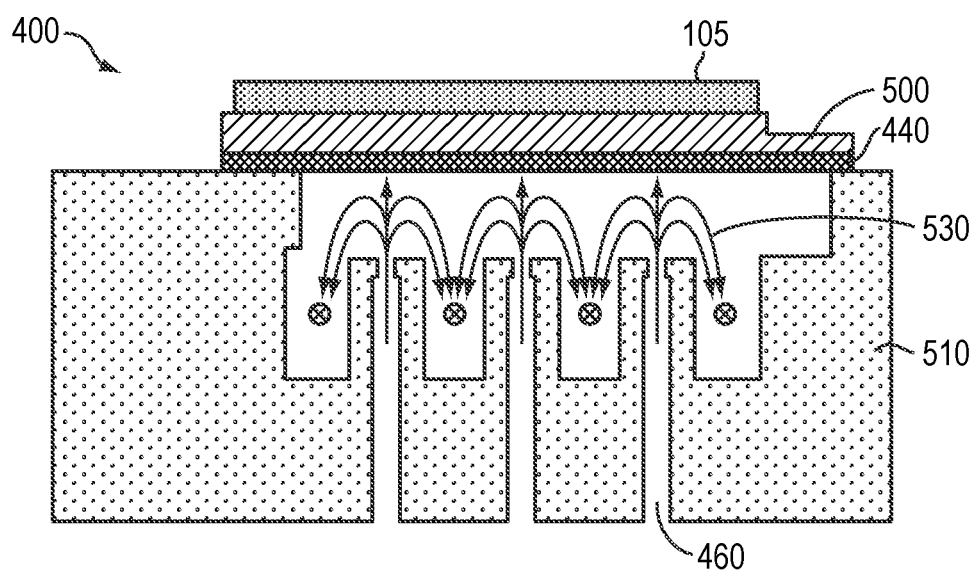

FIGS. 5A and 5B schematically depict additional examples of heat sinks 400 that may be substantially completely or partially coated with a diamond coating in accordance with embodiments of the present invention. As shown, FIG. 5A depicts a heat sink 400 utilizing lateral coolant flow for cooling of a beam emitter 105 disposed thereon or thereover in the manner of a "microchannel cooler." As shown, the heat sink 400 may include, consist essentially of, or consist of an electrode mount (or "conductor") 500 on which the beam emitter 105 is disposed and, below the conductor 500, a housing 510 defining one or more conduits 460 therein for conducting a heat-transfer fluid 530 therethrough. Specifically, flow of the heat-transfer fluid 530 (which may include, consist essentially of, or consist of, for example, water) conducts heat away from the conductor 500 and beam emitter 510. As detailed herein, one or more surfaces of the conductor 500 and/or the housing 510 may be etched and have a diamond coating 440 deposited thereover for protection from erosion and/or corrosion resulting from exposure to the heat-transfer fluid 530. In various embodiments, the conductor 500 includes, consists essentially of, or consists of the metal-matrix composite containing a discrete thermally conductive phase 410 (that includes, consists essentially of, or consist of the one or more thermally conductive metals) and a discrete refractory phase 420 (that includes, consists essentially of, or consist of the one or more refractory metals). As shown in FIG. 5A, all or a portion of the surface of conductor 500 (e.g., the portion(s) of the surface to be exposed to heat-transfer fluid 530) may be etched and have diamond coating 440 formed thereover, and the conductor 500 may be subsequently joined or sealed to the housing 510 (e.g., by brazing or soldering, or via clamping with a seal (e.g., one or more o-rings) therebetween). In other embodiments, all or a portion of housing 510 (e.g., the portion(s) of the surface to be exposed to heat-transfer fluid 530) may also be etched and have a diamond coating 440 formed thereover.

FIG. 5B depicts an exemplary heat sink 400 that may be utilized in accordance with embodiments of the present invention and that is similar to the heat sink 400 depicted in FIG. 5A. In FIG. 5B, the heat sink 400 features a housing 510 defining one or more conduits 460 that conduct therethrough heat-transfer fluid 530 such that the heat-transfer fluid 530 vertically impinges on the underside of the conductor 500. Examples of such heat sinks may be found in, for example, U.S. patent application Ser. No. 15/627,917, filed on Jun. 20, 2017, the entire disclosure of which is incorporated by reference herein. As with the heat sink 400 depicted in FIG. 5A, for the heat sink 400 depicted in FIG. 5B, all or a portion of the surface of the conductor 500 and/or of the housing 510 may be etched and coated with diamond, and the conductor 500 may be joined or sealed to the housing 510 (e.g., by brazing or soldering, or via clamping with a seal (e.g., one or more o-rings) therebetween) either before or after the etching and coating formation.

In various embodiments, only one or more portions of the surface of the heat sink 400 are etched to remove the thermally conductive phase and have the diamond coating deposited thereon. For example, regions where the diamond coating is not desired may be masked via deposition or formation of a masking material that is substantially impervious to the etchant utilized to remove the thermally conductive phase from the exposed surface of the heat sink. The masking material may thus include, consist essentially of, or consist of, for example, photoresist, wax, an insulator layer such as an oxide and/or nitride layer, etc. After portions of the heat sink have been selectively etched, the masking material may be removed (e.g., via an etchant or other removal agent). Such mask formation and removal may be accomplished by one of skill in the art without undue experimentation. The diamond coating may be deposited over the partially etched heat sink, and the diamond coating may substantially adhere only on etched portions of the heat sink. For example, any coating formed on unetched portions of the heat sink may be subsequently easily removed by mechanical force (e.g., grinding, polishing, etc.)

Figure 6:
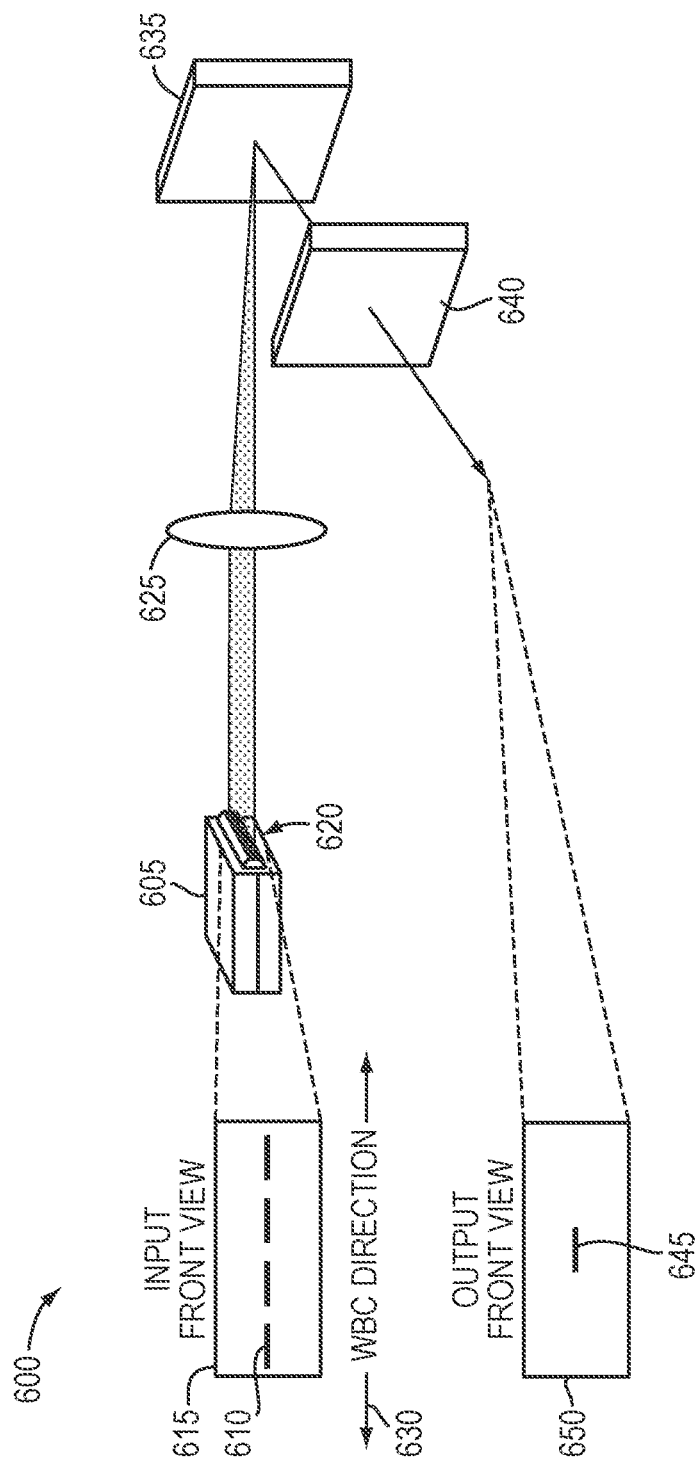
FIG. 6 is a schematic view of a wavelength beam combining laser system incorporating a packaged laser in accordance with various embodiments of the invention.

Packaged lasers in accordance with embodiments of the present invention may be utilized in WBC laser systems. FIG. 6 depicts an exemplary WBC laser system 600 that utilizes a packaged laser 605. The packaged laser 605 may incorporate, for example, a beam emitter disposed on a heat sink prepared as detailed herein (e.g., heat sink 400). For example, the packaged laser 605 may be similar to packaged lasers 100 or 300. In the example of FIG. 6, laser 605 features a diode bar having four beam emitters emitting beams 610 (see magnified input view 615), but embodiments of the invention may utilize diode bars emitting any number of individual beams or two-dimensional arrays or stacks of diodes or diode bars. In view 615, each beam 610 is indicated by a line, where the length or longer dimension of the line represents the slow diverging dimension of the beam, and the height or shorter dimension represents the fast diverging dimension. A collimation optic 620 may be used to collimate each beam 610 along the fast dimension. Transform optic(s) 625, which may include, consist essentially of, or consist of one or more cylindrical or spherical lenses and/or mirrors, are used to combine each beam 610 along a WBC direction 630. The transform optics 625 then overlap the combined beam onto a dispersive element 635 (which may include, consist essentially of, or consist of, e.g., a diffraction grating such as a reflective or transmissive diffraction grating), and the combined beam is then transmitted as single output profile onto an output coupler 640. The output coupler 640 then transmits the combined beams 645 as shown on the output front view 650. The output coupler 640 is typically partially reflective and acts as a common front facet for all the laser elements in this external cavity system 600. An external cavity is a lasing system where the secondary mirror is displaced at a distance away from the emission aperture or facet of each laser emitter. In some embodiments, additional optics are placed between the emission aperture or facet and the output coupler or partially reflective surface.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

The invention claimed is:

1. A method of heat sink preparation, the method comprising:
providing a heat sink comprising a metal-matrix composite of a thermally conductive metal and a refractory metal, the heat sink containing the thermally conductive metal at a first concentration;
etching at least a portion of a surface of the heat sink to deplete at least a portion of the thermally conductive metal therefrom, thereby forming on the at least a portion of the surface a depleted region comprising the refractory metal; and
depositing a coating comprising diamond over the depleted region,
wherein (i) the heat sink comprises a fluid inlet and a fluid outlet, (ii) the at least a portion of the surface of the heat sink is disposed in a portion of the heat sink fluidly coupled to the fluid inlet and the fluid outlet, and (iii) a thickness of the coating ranges from approximately 2 μm to approximately 5 μm.

2. The method of claim 1, wherein the depleted region comprises the thermally conductive metal at a second concentration lower than the first concentration.

3. The method of claim 2, wherein a concentration of the thermally conductive metal in the depleted region increases in a direction away from the surface of the heat sink.

4. The method of claim 1, wherein the depleted region is substantially free of the thermally conductive metal.

5. The method of claim 1, wherein the thermally conductive metal comprises at least one of Cu or Ag.

6. The method of claim 1, wherein the refractory metal comprises at least one of W, Mo, or Ti.

7. The method of claim 1, wherein (i) the thermally conductive metal comprises Cu and (ii) the refractory metal comprises W.

8. The method of claim 1, wherein the coating is deposited by chemical vapor deposition.

9. The method of claim 1, wherein a thickness of the depleted region ranges from approximately 1 μm to approximately 10 μm.

10. The method of claim 1, wherein the at least a portion of the surface of the heat sink is etched using a solution comprising (i) ferric chloride, (ii) acetic acid and hydrogen peroxide, or (iii) hydrochloric acid and hydrogen peroxide.

11. The method of claim 1, wherein at least part of the at least a portion of the surface of the heat sink is disposed within a conduit internal to the heat sink.

12. The method of claim 1, further comprising thermally coupling a beam emitter to the heat sink.

13. The method of claim 1, wherein the thermally conductive metal comprises at least one of Ag, Al, or Au.

14. The method of claim 1, wherein the refractory metal comprises at least one of Ti, Nb, Ta, Re, Zr, Hf, Ru, Os, Ir, or Rh.

15. The method of claim 1, wherein the at least a portion of the surface of the heat sink is etched using a solution comprising (i) ferric chloride, or (ii) acetic acid and hydrogen peroxide.

16. A method of heat sink preparation, the method comprising:
providing a heat sink comprising a metal-matrix composite of a thermally conductive metal and a refractory metal, the heat sink containing the thermally conductive metal at a first concentration;
etching a first portion of a surface of the heat sink to deplete at least a portion of the thermally conductive metal therefrom, thereby forming on the first portion of the surface a depleted region comprising the refractory metal;
prior to etching the first portion of the surface of the heat sink, masking a second portion of the surface of the heat sink to prevent etching thereof; and
depositing a coating comprising diamond over the depleted region,
wherein a thickness of the coating ranges from approximately 2 μm to approximately 5 μm.

17. The method of claim 1, further comprising roughening at least a portion of the depleted region prior to deposition of the coating.

18. The method of claim 16, wherein the depleted region comprises the thermally conductive metal at a second concentration lower than the first concentration.

19. The method of claim 18, wherein a concentration of the thermally conductive metal in the depleted region increases in a direction away from the surface of the heat sink.

20. The method of claim 16, wherein the depleted region is substantially free of the thermally conductive metal.

21. The method of claim 16, wherein the thermally conductive metal comprises at least one of Cu or Ag.

22. The method of claim 16, wherein the refractory metal comprises at least one of W, Mo, or Ti.

23. The method of claim 16, wherein (i) the thermally conductive metal comprises Cu and (ii) the refractory metal comprises W.

24. The method of claim 16, wherein the coating is deposited by chemical vapor deposition.

25. The method of claim 16, wherein a thickness of the depleted region ranges from approximately 1 μm to approximately 10 μm.

26. The method of claim 16, wherein the first portion of the surface of the heat sink is etched using a solution comprising (i) ferric chloride, (ii) acetic acid and hydrogen peroxide, or (iii) hydrochloric acid and hydrogen peroxide.

27. The method of claim 16, wherein at least part of the first portion of the surface of the heat sink is disposed within a conduit internal to the heat sink.

28. The method of claim 16, wherein (i) the heat sink comprises a fluid inlet and a fluid outlet, and (ii) at least part of the first portion of the surface of the heat sink is fluidly coupled to the fluid inlet and the fluid outlet.

29. The method of claim 16, further comprising thermally coupling a beam emitter to the heat sink.

30. The method of claim 16, further comprising roughening at least a portion of the depleted region prior to deposition of the coating.

31. The method of claim 16, wherein the thermally conductive metal comprises at least one of Ag, Al, or Au.

32. The method of claim 16, wherein the refractory metal comprises at least one of Ti, Nb, Ta, Re, Zr, Hf, Ru, Os, Ir, or Rh.

33. The method of claim 16, wherein the first portion of the surface of the heat sink is etched using a solution comprising (i) ferric chloride, or (ii) acetic acid and hydrogen peroxide.

* * * * *